(12) United States Patent
Chang et al.

(10) Patent No.: US 7,460,036 B2
(45) Date of Patent: Dec. 2, 2008

(54) VARIABLE LENGTH DECODER UTILIZING REORDERED INDEX DECODING LOOK-UP-TABLE (LUT) AND METHOD OF USING THE SAME

(75) Inventors: Chih-Yu Chang, Hsinchu (TW); Hsin-Hao Chen, Hsinchu (TW); Oscal Tzyh-Chiang Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/868,864

(22) Filed: Oct. 8, 2007

(65) Prior Publication Data

US 2008/0218387 A1  Sep. 11, 2008

(30) Foreign Application Priority Data

Mar. 7, 2007  (TW)  ............................... 96107893 A

(51) Int. Cl.
*H03M 7/40* (2006.01)
(52) U.S. Cl. .............................. 341/67; 341/50; 341/51; 341/107
(58) Field of Classification Search .................. 341/50, 341/51, 67, 107; 382/246, 307; 712/210; 345/619; 375/240.03
See application file for complete search history.

(56) References Cited

U.S. PATENT DOCUMENTS

| | | | |
|---|---|---|---|
| 6,272,257 B1 * | 8/2001 | Prokop | 382/246 |
| 6,289,138 B1 * | 9/2001 | Yip et al. | 382/307 |
| 6,349,379 B2 * | 2/2002 | Gibson et al. | 712/210 |
| 6,707,463 B1 * | 3/2004 | Gibson et al. | 345/619 |
| 2005/0175091 A1 * | 8/2005 | Puri et al. | 375/240.03 |

\* cited by examiner

*Primary Examiner*—Jean B Jeanglaude
(74) *Attorney, Agent, or Firm*—Workman Nydegger

(57) ABSTRACT

A variable length decoder and its decoding method utilizing a reordered index decoding look-up-table, and that is utilized to incorporate a plurality of decoding LUT's into a single reordered index decoding LUT for use in decoding by making use of the output correlation rule obtained through integrating a plurality of decoding LUT's. Thus, when proceeding with the variable length decodings, the multiplexer has only to select the correct reordered index value from among a plurality of reordered index values as based on the previous decoding results, and then find out the corresponding remapping index value and compensation value, thus searching and obtaining the corresponding reordered index output result in the reordered index decoding LUT through utilizing the remapping index value, hereby obtaining the output result through proceeding with the operations required by making use of the compensation value.

16 Claims, 12 Drawing Sheets

| Index | Run | Level | Index | Run | Level | Index | Run | Level |
|---|---|---|---|---|---|---|---|---|
| 0 | 0 | 1 | 40 | 2 | 7 | 80 | 9 | 1 |
| 1 | 0 | 2 | 41 | 2 | 8 | 81 | 9 | 2 |
| 2 | 0 | 3 | 42 | 2 | 9 | 82 | 9 | 3 |
| 3 | 0 | 4 | 43 | 2 | 10 | 83 | 9 | 4 |
| 4 | 0 | 5 | 44 | 2 | 11 | 84 | 10 | 1 |
| 5 | 0 | 6 | 45 | 2 | 12 | 85 | 10 | 2 |
| 6 | 0 | 7 | 46 | 3 | 1 | 86 | 10 | 3 |
| 7 | 0 | 8 | 47 | 3 | 2 | 87 | 11 | 1 |
| 8 | 0 | 9 | 48 | 3 | 3 | 88 | 11 | 2 |
| 9 | 0 | 10 | 49 | 3 | 4 | 89 | 11 | 3 |
| 10 | 0 | 11 | 50 | 3 | 5 | 90 | 12 | 1 |
| 11 | 0 | 12 | 51 | 3 | 6 | 91 | 12 | 2 |
| 12 | 0 | 13 | 52 | 3 | 7 | 92 | 12 | 3 |
| 13 | 0 | 14 | 53 | 3 | 8 | 93 | 13 | 1 |
| 14 | 0 | 15 | 54 | 3 | 9 | 94 | 13 | 2 |
| 15 | 0 | 16 | 55 | 3 | 10 | 95 | 13 | 3 |
| 16 | 0 | 17 | 56 | 3 | 11 | 96 | 14 | 1 |
| 17 | 0 | 18 | 57 | 4 | 1 | 97 | 14 | 2 |

FIG.2A (PRIOR ART)

| 18 | 0 | 19 | 58 | 4 | 2 | 98 | 3 |
|---|---|---|---|---|---|---|---|
| 19 | 1 | 1 | 59 | 4 | 3 | 99 | 1 |
| 20 | 1 | 2 | 60 | 4 | 4 | 100 | 2 |
| 21 | 1 | 3 | 61 | 4 | 5 | 101 | 3 |
| 22 | 1 | 4 | 62 | 4 | 6 | 102 | 1 |
| 23 | 1 | 5 | 63 | 5 | 1 | 103 | 2 |
| 24 | 1 | 6 | 64 | 5 | 2 | 104 | 1 |
| 25 | 1 | 7 | 65 | 5 | 3 | 105 | 2 |
| 26 | 1 | 8 | 66 | 5 | 4 | 106 | 1 |
| 27 | 1 | 9 | 67 | 5 | 5 | 107 | 1 |
| 28 | 1 | 10 | 68 | 6 | 1 | 108 | 1 |
| 29 | 1 | 11 | 69 | 6 | 2 | 109 | 1 |
| 30 | 1 | 12 | 70 | 6 | 3 | 110 | 1 |
| 31 | 1 | 13 | 71 | 6 | 4 | 111 | 1 |
| 32 | 1 | 14 | 72 | 7 | 1 | 112 | 1 |
| 33 | 1 | 15 | 73 | 7 | 2 | 113 | 1 |
| 34 | 2 | 1 | 74 | 7 | 3 | 114 | 1 |
| 35 | 2 | 2 | 75 | 7 | 4 | 115 | 1 |
| 36 | 2 | 3 | 76 | 8 | 1 | 116 | 1 |
| 37 | 2 | 4 | 77 | 8 | 2 | 117 | 1 |
| 38 | 2 | 5 | 78 | 8 | 3 | 118 | 1 |
| 39 | 2 | 6 | 79 | 8 | 4 | | |

FIG.2B (PRIOR ART)

| Index | Run | Level | Index | Run | Level | Index | Run | Level |
|---|---|---|---|---|---|---|---|---|
| 0 | 0 | 1 | 33 | 1 | 11 | 66 | 7 | 4 |
| 1 | 0 | 2 | 34 | 2 | 1 | 67 | 8 | 1 |
| 2 | 0 | 3 | 35 | 2 | 2 | 68 | 8 | 2 |
| 3 | 0 | 4 | 36 | 2 | 3 | 69 | 8 | 3 |
| 4 | 0 | 5 | 37 | 2 | 4 | 70 | 9 | 1 |
| 5 | 0 | 6 | 38 | 2 | 5 | 71 | 9 | 2 |
| 6 | 0 | 7 | 39 | 2 | 6 | 72 | 9 | 3 |
| 7 | 0 | 8 | 40 | 2 | 7 | 73 | 10 | 1 |
| 8 | 0 | 9 | 41 | 2 | 8 | 74 | 10 | 2 |
| 9 | 0 | 10 | 42 | 3 | 1 | 75 | 10 | 3 |
| 10 | 0 | 11 | 43 | 3 | 2 | 76 | 11 | 1 |
| 11 | 0 | 12 | 44 | 3 | 3 | 77 | 11 | 2 |
| 12 | 0 | 13 | 45 | 3 | 4 | 78 | 11 | 3 |
| 13 | 0 | 14 | 46 | 3 | 5 | 79 | 12 | 1 |
| 14 | 0 | 15 | 47 | 3 | 6 | 80 | 12 | 2 |
| 15 | 0 | 16 | 48 | 3 | 7 | 81 | 13 | 1 |
| 16 | 0 | 17 | 49 | 4 | 1 | 82 | 13 | 2 |
| 17 | 0 | 18 | 50 | 4 | 2 | 83 | 14 | 1 |

FIG.3A (PRIOR ART)

| 18 | 0 | 19 |    | 4 |   | 3  | 14 | 2 |
|----|---|----|----|---|---|----|----|---|
| 19 | 0 | 20 | 51 | 4 |   | 84 | 14 | 2 |
| 20 | 0 | 21 | 52 | 4 | 3 | 85 | 15 | 1 |
| 21 | 0 | 22 | 53 | 4 | 4 | 86 | 15 | 2 |
| 22 | 0 | 23 | 54 | 5 | 5 | 87 | 16 | 1 |
| 23 | 1 | 1  | 55 | 5 | 1 | 88 | 16 | 2 |
| 24 | 1 | 2  | 56 | 5 | 2 | 89 | 17 | 1 |
| 25 | 1 | 3  | 57 | 5 | 3 | 90 | 18 | 1 |
| 26 | 1 | 4  | 58 | 5 | 4 | 91 | 19 | 1 |
| 27 | 1 | 5  | 59 | 6 | 5 | 92 | 20 | 1 |
| 28 | 1 | 6  | 60 | 6 | 1 | 93 | 21 | 1 |
| 29 | 1 | 7  | 61 | 6 | 2 | 94 | 22 | 1 |
| 30 | 1 | 8  | 62 | 7 | 3 | 95 | 23 | 1 |
| 31 | 1 | 9  | 63 | 7 | 4 | 96 | 24 | 1 |
| 32 | 1 | 10 | 64 | 7 | 1 | 97 | 25 | 1 |
|    |   |    | 65 |   | 2 | 98 | 26 | 1 |

FIG.3B (PRIOR ART)

| Reordered index | Run | Level | Reordered Index | Run | Level | Reordered Index | Run | Level |
|---|---|---|---|---|---|---|---|---|
| 0 | 0 | 1 | 33 | 2 | 4 | 66 | 9 | 1 |
| 1 | 0 | 2 | 34 | 2 | 5 | 67 | 9 | 2 |
| 2 | 0 | 3 | 35 | 2 | 6 | 68 | 9 | 3 |
| 3 | 0 | 4 | 36 | 2 | 7 | 69 | 10 | 1 |
| 4 | 0 | 5 | 37 | 2 | 8 | 70 | 10 | 2 |
| 5 | 0 | 6 | 38 | 3 | 1 | 71 | 10 | 3 |
| 6 | 0 | 7 | 39 | 3 | 2 | 72 | 11 | 1 |
| 7 | 0 | 8 | 40 | 3 | 3 | 73 | 11 | 2 |
| 8 | 0 | 9 | 41 | 3 | 4 | 74 | 11 | 3 |
| 9 | 0 | 10 | 42 | 3 | 5 | 75 | 12 | 1 |
| 10 | 0 | 11 | 43 | 3 | 6 | 76 | 12 | 2 |
| 11 | 0 | 12 | 44 | 3 | 7 | 77 | 13 | 1 |
| 12 | 0 | 13 | 45 | 4 | 1 | 78 | 13 | 2 |
| 13 | 0 | 14 | 46 | 4 | 2 | 79 | 14 | 1 |
| 14 | 0 | 15 | 47 | 4 | 3 | 80 | 14 | 2 |
| 15 | 0 | 16 | 48 | 4 | 4 | 81 | 15 | 1 |
| 16 | 0 | 17 | 49 | 4 | 5 | 82 | 15 | 2 |
| 17 | 0 | 18 | 50 | 5 | 1 | 83 | 16 | 1 |

FIG.6A

| 18 | 0 | 19 | 51 | 5 | 2 | 84 | 2 |
|---|---|---|---|---|---|---|---|
| 19 | 1 | 1 | 52 | 5 | 3 | 85 | 1 |
| 20 | 1 | 2 | 53 | 5 | 4 | 86 | 1 |
| 21 | 1 | 3 | 54 | 5 | 5 | 87 | 1 |
| 22 | 1 | 4 | 55 | 6 | 1 | 88 | 1 |
| 23 | 1 | 5 | 56 | 6 | 2 | 89 | 1 |
| 24 | 1 | 6 | 57 | 6 | 3 | 90 | 1 |
| 25 | 1 | 7 | 58 | 6 | 4 | 91 | 1 |
| 26 | 1 | 8 | 59 | 7 | 1 | 92 | 1 |
| 27 | 1 | 9 | 60 | 7 | 2 | 93 | 1 |
| 28 | 1 | 10 | 61 | 7 | 3 | 94 | 1 |
| 29 | 1 | 11 | 62 | 7 | 4 | 95 | 1 |
| 30 | 2 | 1 | 63 | 8 | 1 | 96 | 1 |
| 31 | 2 | 2 | 64 | 8 | 2 | 97 | 1 |
| 32 | 2 | 3 | 65 | 8 | 3 | 98 | 1 |

FIG.6B

| Index | Run | Level | Index | Run | Level | Index | Run | Level |
|---|---|---|---|---|---|---|---|---|
| 0 | 0 | 1 | 29 | 2 | 3 | 57 | 7 | 3 |
| 1 | 0 | 2 | 30 | 2 | 4 | 58 | 8 | 1 |
| 2 | 0 | 3 | 31 | 2 | 5 | 59 | 8 | 2 |
| 3 | 0 | 4 | 32 | 2 | 6 | 60 | 8 | 3 |
| 4 | 0 | 5 | 33 | 2 | 7 | 61 | 9 | 1 |
| 5 | 0 | 6 | 34 | 2 | 8 | 62 | 9 | 2 |
| 6 | 0 | 7 | 35 | 3 | 1 | 63 | 9 | 3 |
| 7 | 0 | 8 | 36 | 3 | 2 | 64 | 10 | 1 |
| 8 | 0 | 9 | 37 | 3 | 3 | 65 | 10 | 2 |
| 9 | 0 | 10 | 38 | 3 | 4 | 66 | 10 | 3 |
| 10 | 0 | 11 | 39 | 3 | 5 | 67 | 11 | 1 |
| 11 | 0 | 12 | 40 | 3 | 6 | 68 | 11 | 2 |
| 12 | 0 | 13 | 41 | 3 | 7 | 69 | 11 | 3 |
| 13 | 0 | 14 | 42 | 4 | 1 | 70 | 12 | 1 |
| 14 | 0 | 15 | 43 | 4 | 2 | 71 | 12 | 2 |
| 15 | 0 | 16 | 44 | 4 | 3 | 72 | 12 | 3 |

| | | | | | | | | |
|---|---|---|---|---|---|---|---|---|
| 16 | 1 | 1 | 45 | 4 | 4 | 73 | 13 | 1 |
| 17 | 1 | 2 | 46 | 4 | 5 | 74 | 13 | 2 |
| 18 | 1 | 3 | 47 | 5 | 1 | 75 | 13 | 3 |
| 19 | 1 | 4 | 48 | 5 | 2 | 76 | 14 | 1 |
| 20 | 1 | 5 | 49 | 5 | 3 | 77 | 14 | 2 |
| 21 | 1 | 6 | 50 | 5 | 4 | 78 | 15 | 1 |
| 22 | 1 | 7 | 51 | 6 | 1 | 79 | 15 | 2 |
| 23 | 1 | 8 | 52 | 6 | 2 | 80 | 16 | 1 |
| 24 | 1 | 9 | 53 | 6 | 3 | 81 | 17 | 1 |
| 25 | 1 | 10 | 54 | 6 | 4 | 82 | 18 | 1 |
| 26 | 1 | 11 | 55 | 7 | 1 | 83 | 19 | 1 |
| 27 | 2 | 1 | 56 | 7 | 2 | 84 | 20 | 1 |
| 28 | 2 | 2 | | | | | | |

US 7,460,036 B2

VARIABLE LENGTH DECODER UTILIZING REORDERED INDEX DECODING LOOK-UP-TABLE (LUT) AND METHOD OF USING THE SAME

CROSS-REFERENCE TO RELATED APPLICATIONS

This non-provisional application claims priority under 35 U.S.C. §119(a) on Patent Application No(s). 096107893 filed in Taiwan, R.O.C. on Mar. 7, 2007, the entire contents of which are hereby incorporated by reference.

BACKGROUND

1. Field of Invention

The invention relates to a decoder and its associated decoding method, and in particular to a variable length decoder and method of implementing the same, that is utilized to restore the correct output result through integrating a plurality of decoding look-up-table tables into a single reordered index decoding look-up-table in cooperation with compensation value calculation through mapping of the reordered index value.

2. Related Art

In the processing of the dynamic image compression, the process of decoding the codeword string usually requires utilization of the Variable Length Decoding (VLD) technology.

In the hardware design of ordinary variable length decoder, it usually includes the VLD designed according to the requirement of a plurality of different decoding look-up tables. In the actual implementation of VLD, after decoding and obtaining the corresponding index value by the respective VLD index decoder, the corresponding output result is obtained from the corresponding LUT by making use of the respective index value. Finally, the output results required are obtained through a multiplexer based on the previous decoding results.

As shown in FIG. 1, upon entering into a variable length decoder by a codeword string 50, then depending on the number of LUT's required for decoding, the corresponding number VLD index decoders 110, 111 are utilized to generate the respective index values (a first index value 113 and a second index value 115), these index values are then sent into the corresponding LUT 120, 121 to proceed with the search for the output results (a first output result 123 and a second output result 125). And finally, a multiplexer 130 is utilized to search and find out the output result 55 actually required from among the various different output results based on the previous decoding information. Since, in general, in the hardware realization of Variable Length Decoder, the creation of LUT is realized through a Read Only Memory (ROM), a Content Address Memory (CAM), or a Programmable Logic Array (PLA). Supposing that the maximum-bit-length used for decoding is n, and in case that LUT is realized by making use of ROM, then a table of $2^n$ items is required, thus resulting in a huge waste of large amount memory space. Even if the LUT is realized through CAM or PLA, the number of table items required is equivalent to the number of data items to be decoded.

In the past, the improvement proposed concerning the Variable Length Decoder and its decoding method is aimed at determining how to simplify the data items contained in a single LUT. By doing so, the benefit of reducing the memory space and logic gates used can be achieved, in case that a single LUT is utilized in decoding. However, in case that two (or more) LUT's are utilized for decoding and that the ratio is high for the same output result, the effect of reducing the memory space and logic gates required by this approach is rather limited and requires further improvements.

SUMMARY OF THE INVENTION

In view of the above-mentioned problems and drawbacks of the prior art that the memory space and number of logic gates utilized can not be effectively reduced for the case that two (or more) LUT's are used for decoding and the ratio of the identical output results is high, the invention discloses a variable length decoder utilizing a reordered index decoding LUT and a decoding method using the same, hereby achieving the objective of simplifying the hardware design and reducing the hardware cost.

The major technical characteristics of the invention lies in incorporating a plurality of decoding LUT's compatible with output correlation rule into a single reordered index decoding LUT for decoding purpose. In order that the memory space utilized may further be reduced, a compensation value calculation is utilized along with an index remapping method, so that the number of total index items of the reordered index decoding LUT can further be reduced, hereby achieving the overall reduction of the memory space required.

With regard to the decoding efficiency, the technical means of a single reordered index decoding LUT is used in the invention, thus reducing the complexity of hardware design (for example, the design of multiplexer), as such achieving better decoding efficiency as compared with the technology of prior art requiring performing a plurality of decodings relative to various different LUT's.

The invention discloses a Variable Length Decoder utilizing a reordered index decoding look-up-table (LUT), including: at least two reordered index decoder, a multiplexer, an index remapping device, a compensation mapping device, a reordered index decoding LUT and a compensation/output operator.

The invention also provides a decoding method utilizing the Variable Length Decoder, including the following steps:

(1) creating an output correlation rule for two or more decoding LUT's, that is utilized in integrating various decoding LUT's into a reordered index decoding LUT in a Variable Length Decoder;

(2) Reading the codeword string input to a variable length decoder (VLD), and generating at least a corresponding reordered index value through decoding;

(3) Selecting a single value from among a plurality of reordered index values, based on the recorded previous decoded data obtained through processing the previous codeword string by the multiplexer;

(4) Performing the following steps by making use of the reordered index values:
  (a) searching and obtaining the remapping index values corresponding to the reordered index value through mapping;
  (b) searching and obtaining the compensation values corresponding to the reordered index value through mapping;

(5) Searching and obtaining the reordered index output results through the reordered index decoding LUT by making use of the remapping index value; and (6) Obtaining the correct and final output results through performing logical operation on the reordered index output result and the compensation value.

As such, in the condition of high ratio of equal output results for a plurality of decoding LUT's, the method of the invention can be utilized to achieve the effect of reducing the memory space used for storing the decoding LUT's, and reducing the number of logic gates used for implementing the decoding determination operation, thus simplifying the hardware design and reducing the hardware cost.

The characteristics and implementation of the invention will be described in detail as follows together with the attached drawings and the preferred embodiments.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow for illustration only, and thus are not limitative of the invention, and wherein:

FIGS. 2A & 2B show a first decoding LUT utilized in an embodiment of the reordered index decoding LUT according to an embodiment of the invention;

FIGS. 3A & 3B show a second decoding LUT utilized in an embodiment of the reordered index decoding LUT according to an embodiment of the invention;

FIGS. 6A & 6B show a reordered index decoding LUT obtained through integrating the LUT's of FIGS. 2A to 3B;

FIGS. 7A & 7B show a third decoding LUT utilized in an embodiment of the reordered index decoding LUT according to an embodiment of the invention.

DETAILED DESCRIPTION OF THE INVENTION

The purpose, construction, features, and functions of the invention can be appreciated and understood more thoroughly through the following detailed description with reference to the attached drawings.

In the following, the preferred embodiments of the invention will be described in detail together with the attached drawings.

Figure 4:
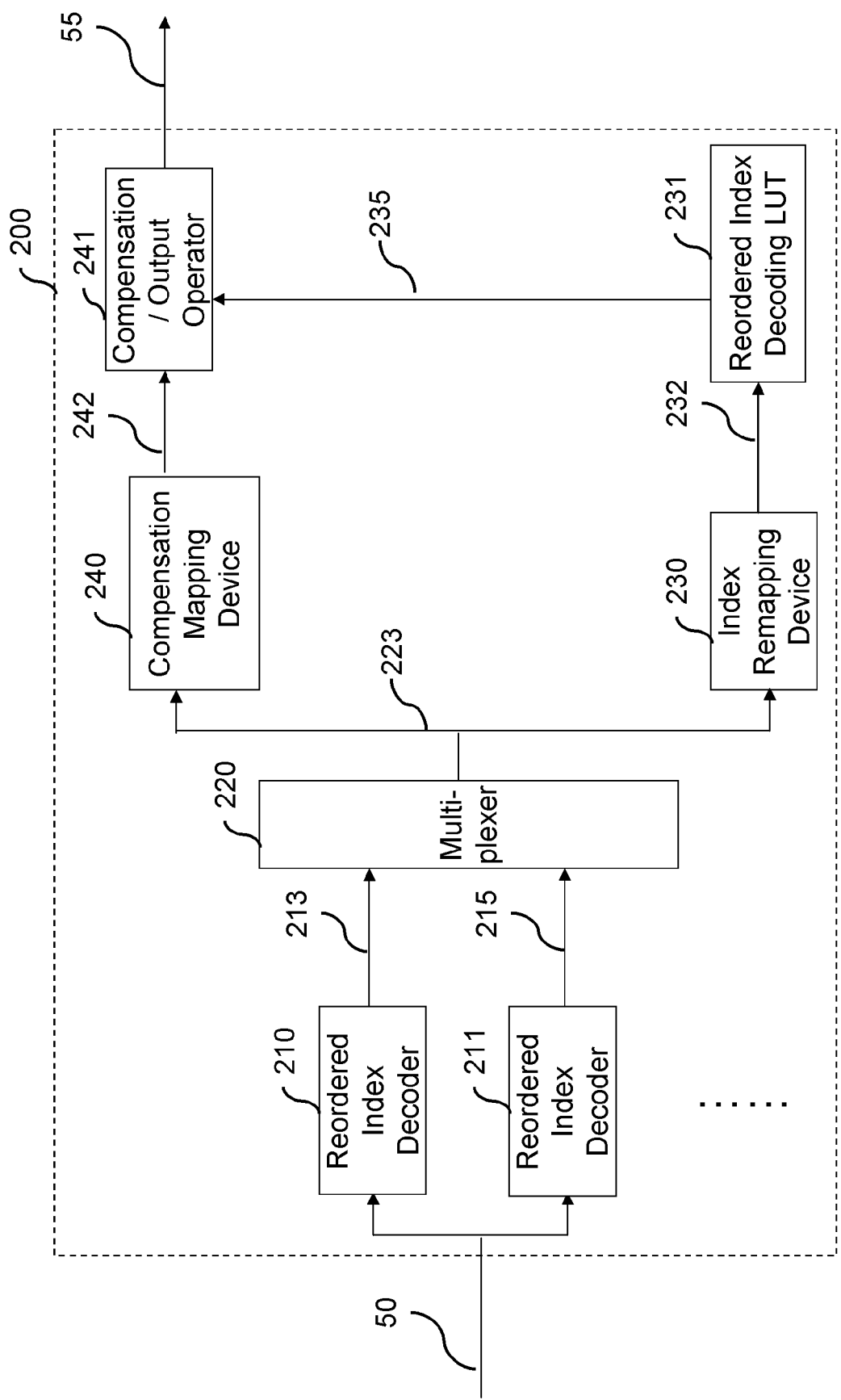
FIG. 4 is a functional block diagram of a variable length decoder according to an embodiment of the invention.

FIG. 4 is a functional block diagram of a variable length decoder, and that is used to implement the variable length decoding (VLD) for the input coded codeword string 50, hereby generating the correct output results 55, the functions and operations of the various blocks are explained as follows.

(1) Firstly, a variable length decoder 200 is provided with at least two reordered index decoders (210 and 211), that are used to proceed with the decoding process for reading the input codeword string 50, thus generating at least a corresponding reordered index value 213, 215 respectively through a decoding procedure.

It must be emphasized here that, the number of the reordered index decoders required to be provided in a variable length decoder 200 is equivalent to the number of decoding LUT's required to be used when decoding is performed by the variable length decoder 200. Thus in decoding, each of the respective reordered index decoders still corresponds to a separate LUT. In general, the number of LUT's required by a variable length decoder 200 in performing VLD decoding can be varied depending on the various decoding requirements. In the invention, the technical characteristics of incorporating a plurality of decoding LUT's into a single reordered index decoding LUT are emphasized. Thus, in order to achieve the purpose, at least two reordered index decoders are required; however, the invention is not limited to this. In this preferred embodiment, two reordered index decoders (210 and 211) are utilized to describe the decoding operation of the invention by making use of FIG. 4. However, the principle of decoding operation is similar, when the number of reordered index decoders required exceeds two, and thus it will not be repeated here for brevity.

(2) A multiplexer 220, coupled to reordered index decoders (210 and 211), and is used to select and output one of reordered index values 213, 215 based on the previous decoding results.

Figure 1:
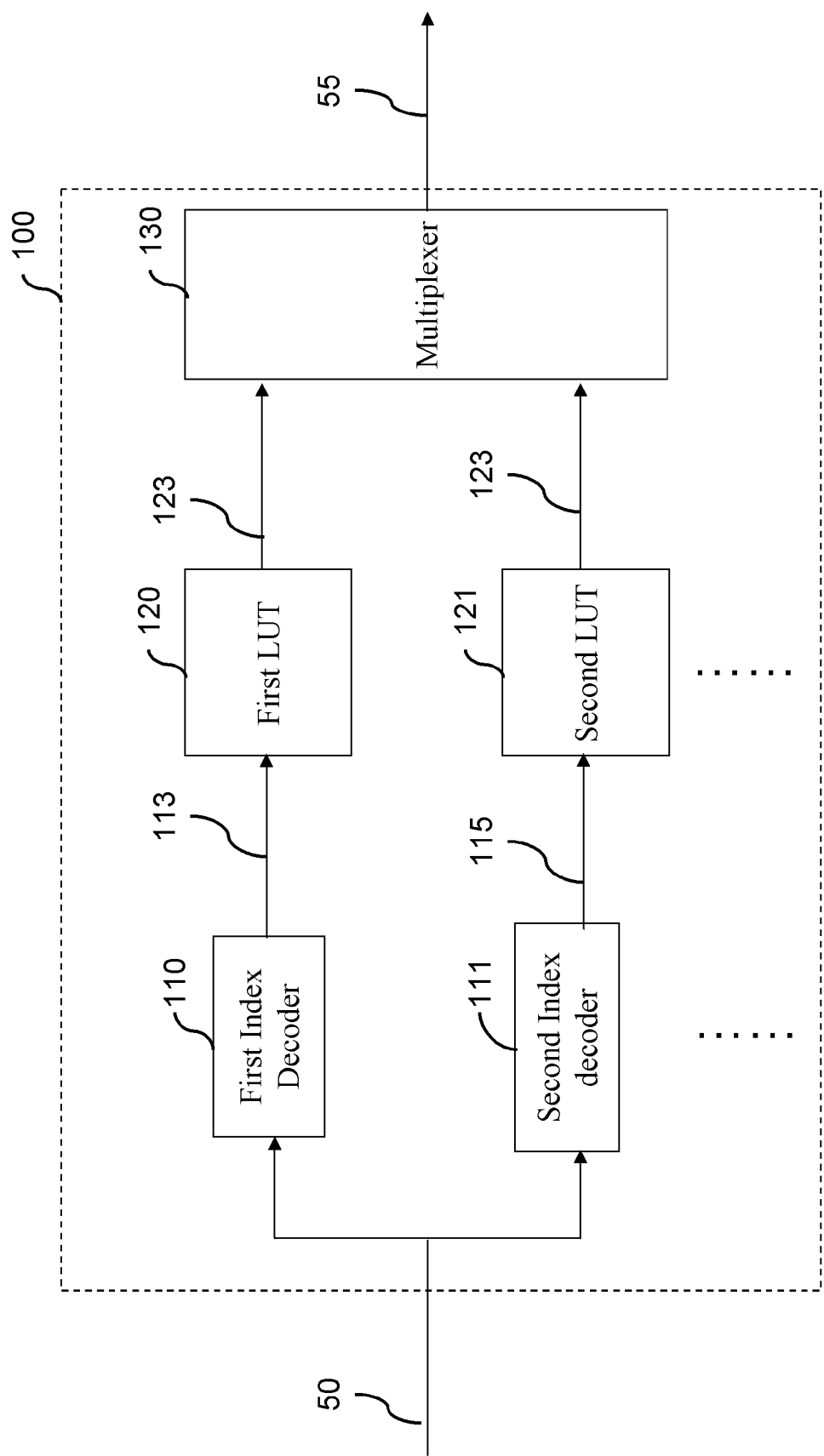
FIG. 1 is a functional block diagram of a variable length decoder according to prior art.

The difference of the technical characteristics mentioned in FIG. 4 with that of the prior art mentioned in FIG. 1 is that, in the prior art, multiplexer 130 is coupled to the outputs of LUT's (210 and 211) to make selection between the output results of LUT's. In the invention, a multiplexer 220 is coupled to the output of reordered index decoders (210 and 211). Since the plurality of LUT's are reordered and integrated into a single reordered index decoding LUT 231, as such multiplexer 220 is used to make selection between the reordered index values (the first reordered index value 213 and the second reordered index value 215) output respectively by each of the reordered index decoders (210 and 211). The reordered index values 223 thus obtained is transmitted to an index remapping device 230 and a compensation mapping device 240 for further processing.

(3) An index remapping device 230, used to search the reordered index decoding LUT 231 to obtain the remapping index value 232 corresponding to the reordered index value.

In order to reduce the total index number in a reordered index decoding LUT 231, in the invention, an index remapping is performed for the respective reordered index values in the various LUT's. The keypoint of this approach mainly concerns with the fact that, there exist in the respective LUT's at least a same output item having the same output value, thus index remapping is performed for the portions obtained from the output values of the remaining and different output items in the respective LUT's through the operation of a mathematic equation, and then the results of the index remapping is stored in an index remapping device 230. When a reordered index value is input and received, the corresponding remapping index value 232 can be obtained through searching.

(4) A reordered index decoding LUT 231, created through the output correlation rule based on two or more decoding LUT's, and is used to generate reordered index output results 235 by making use of the remapping index value 232 output by an index remapping device 230.

As to the output correlation rules, there can be various kinds of output correlation rules depending on the output items and types of output values in the respective LUT's. Basically, they can be classified into the following configurations, however, the invention is not limited to this, and they can be varied depending on the output item or output value of the respective LUT utilized by variable length decoder 200. In the following, the LUT utilized in VLD decoding in a VC-1 decoder of Microsoft Corporation is taken as an example in explaining the Preferred Embodiment of the invention. Please refer to FIGS. 2A to 3B.

(a). The first configuration: the output items of the respective LUT are the same, with each output item having the same output value.

As shown in FIG. 2A to FIG. 3B, two output items RUN and LEVEL are provided in each of the two LUT's (RUN and LEVEL may also be referred to as operation level group), with each index item having the corresponding output value. For example, in FIG. 2A to FIG. 3B, the output items RUN and LEVEL and their output values are all the same for index items 0-18, thus these index items can be incorporated as the index items having new reordered index values in reordered index decoding LUT 231. Moreover, for example, the output items RUN and LEVEL and their output values for index items 19-29 of FIG. 2B and index items 23-33 of FIG. 3B are all the same. Thus the related index items can be incorporated to obtain new reordered index values similarly according to the output correlation rule.

(b). The second configuration: at least one output item of the respective LUT's is the same, thus the output value of at least an output item in the respective decoding LUT can be obtained through the operation of a mathematical equation.

By way of example, index items 30-33 of a decoding LUT in FIG. 2B, and the LUT in FIGS. 3A & 3B are provided with the same RUN output items, and the output value 1 of output item RUN of index items 30-33 is the same as that of index items 19-29 in the same LUT, and the output values of output item LEVEL of index items 30-33 constitute an arithmetic progression relation with those of the last index item (namely, index item 29) of index items 19-29 (the difference of output value of LEVEL of index item 30 and that of index item 29 is 1, and the difference of output value of LEVEL of index item 31 and that of index item 29 is 2 . . . , and the rest can be inferred in the same manner). As such, the corresponding reordered index value can be obtained for index items 30-33 as shown in FIG. 2B, and be recorded in a reordered index value & compensation value correlation table 550. Furthermore, index items 19-22 of a decoding LUT in FIG. 3B, and the LUT in FIGS. 2A & 2B are provided with the same RUN output item, and the output value 0 of output item RUN of index items 19-22 is the same as that of index items 0-18 in the same LUT, and the output values of output item LEVEL of index items 19-22 constitute an arithmetic progression relation with that of the last index item (namely, index item 18) of index items 0-18. As such, the corresponding reordered index values can be obtained for index items 19-22 as shown in FIG. 3B, and be recorded in a reordered index value & compensation value correlation table 550.

Figure 5:
FIG. 5 is a reordered index value & compensation value correlation table generated by a reordered index decoding LUT obtained through integrating the LUT's of FIGS. 2A to 3B.

As mentioned earlier, the new reordered index values deduced and obtained according to the second configuration are recorded in a reordered index value & compensation value correlation table 550. As shown in FIG. 5, according to the above-mentioned example, when index items 19-22 of LUT in FIG. 3B are reordered as the reordered index values of index items 19-22, then the compensation value for the output item LEVEL of index item 22 is 4, and the compensation value for the output item LEVEL of index item 20 is 2 . . . . That means that when the index item of input codeword is between index items 19-22, then the corresponding LEVEL compensation value can be obtained through searching the reordered index value & compensation value correlation table 550. The meaning of the LEVEL compensation value is that, the actual LEVEL output value can be obtained by adding the LEVEL output value of the last item before index items 19-22 to the compensation value; while the output value of RUN is the same as that of the last item before index items 19-22.

Therefore, according to the example relating to index items 19-22 of FIG. 3B, the results deduced as based on the second configuration can be achieved through the following steps:

A mathematical equation operated in the following manner can be utilized to restore the original LEVEL output value: "when the input reordered index value is 22, the reordered index value must first correspond to the index item 22 of the original LUT (namely, item 22 in FIG. 3B), then obtaining the corresponding compensation value 4 of index item 22 by making use of the reordered index value & compensation value correlation table 550, then obtaining the LEVEL value of the last item (namely item 18) before index items 19-22, thus adding the compensation value 4 to the LEVEL value to get the actual LEVEL value of index item 22 in the original LUT"; while the RUN output value of index item 22 is the same as that of index item 18. Moreover, the mathematical equation mentioned above can be modified and adjusted according to various output correlation rules, and it is in no way limited to the above-mentioned embodiment. For example, the output value correlation can be of a geometric progression relation.

The various output correlation rules mentioned above are not required to be executed simultaneously, it can be utilized selectively under the condition and requirement that, the reordered index decoding LUT 231 keeping the least number of index items The foregoing description is applicable to one of its embodiments, and people familiar with the art are allowed to make appropriate changes and adjustments regarding the above-mentioned output correlation rules, so as to be compatible with the actual requirement of generating a reordered index decoding LUT 231.

(c) The third configuration: at least one output item of the respective LUT's is identical with all the output items in the respective LUT's having different output values.

In other words, in this configuration, there exist not clear and definite correlation between/among output values of the respective LUT's, thus the various index items must be put separately into a reordered index decoding LUT 231. As shown in FIG. 2B, the index items 115-118 contained therein can not produce the correlation relations of the first configuration or the second configuration with any of the index items in FIG. 3B. As such, the index items 115-118 can be considered as independent index items and be added directly into the reordered index decoding LUT 231 together with the corresponding reordered index values.

Upon implementing the output correlation rules such as the three kinds of configurations as mentioned above, each of the respective index items as shown in FIGS. 2A & 2B, FIGS. 3A & 3B may correspond to a new reordered index value in the reordered index decoding LUT 231.

However, according to the design of variable length decoder 200, the multiplexer 220 may select only one from a plurality of reordered index values generated by different reordered index decoders (210 and 211) to proceed with the VLD operations. Thus, in order to further simplify the complexity of LUT, the invention further proposes to perform the remapping operation for all the reordered index values of the generated reordered index decoding LUT 231, and then the original reordered index value is replaced with the new remapping index values. This kind of remapping approach is mainly utilized to further simplify the reordered index items of the second configuration. As shown in FIG. 3B, the LEVEL values of index items 19-22 can be calculated and obtained by means of the LEVEL value of index item 18 and the recorded compensation value. Therefore, in proceeding with the remapping, in the invention, the reordered index values of index items 19-22 can be represented directly by the remapping index value 232 of index item 18. Thus, in the decoding process, in case that the LEVEL value of index item 22 is desired to be calculated, then the index remapping device 230 will transmit the remapping index value 232 of the index item 18 to a compensation/output operator 241, and then the compensation/output operator 241 may find out the LEVEL value of index item 18 directly according to the remapping index value 232, hereby calculating and obtaining directly the actual LEVEL value of index item 22, in cooperation with the compensation value 242 obtained by a compensation mapping device 240 by making use of the reordered index value.

Through the integration of the LUT's contained in FIGS. 2A & 2B and FIGS. 3A & 3B, the reordered index decoding LUT 231 thus produced is as shown in FIGS. 6A & 6B. In the entire reordered index decoding LUT 231, the number of total reordered index items is the sum of the index item number of the respective LUT's after the processing of output correlation rule and sum of the index item number of the respective LUT's after the remapping integration. In practice, the reordered index decoding LUT 231 can be realized through Read Only Memory (ROM), Content Address Memory (CAM), or Programmable Logic Array (PLA). However, the invention is not limited to this.

In practice, the above embodiment is realized by incorporating two LUT's, however, in reality, other LUT's compatible with the same output correlation rules can be integrated altogether, thus achieving better integration efficiency. For example, the LUT's shown in FIG. 7A and FIG. 7B are compatible with the same output correlation rule as that of FIGS. 2A & 2B and FIGS. 3A & 3B. Thus, the LUT's in FIGS. 7A & 7B may also be incorporated into a single reordered index decoding LUT 231, as long as it is conducted in the same manner as shown above in integration and generation of a reordered index decoding LUT 231. As such, the details of which will not be repeated here for brevity.

(5) A compensation mapping device 240, used to search and find the compensation value 242 corresponding to the reordered index value through mapping.

The compensation mapping device 240 is provided with a reordered index value and compensation value correlation table 550 as shown in FIG. 5, wherein the correlation between the reordered index value and the compensation value is recorded. Through this table, the value of compensation for the original index item can be found.

(6) compensation/output operator 241, used to obtain at least an output result through a logic operation, by making use of a reordered index output result 235 transmitted from the reordered index decoding LUT 231 and a compensation value transmitted from the compensation mapping device 240.

The logic operation referred to herein can be a simple addition operation, a subtraction operation or a digit-shifting operation. However, the invention is not limited to this.

Figure 8:
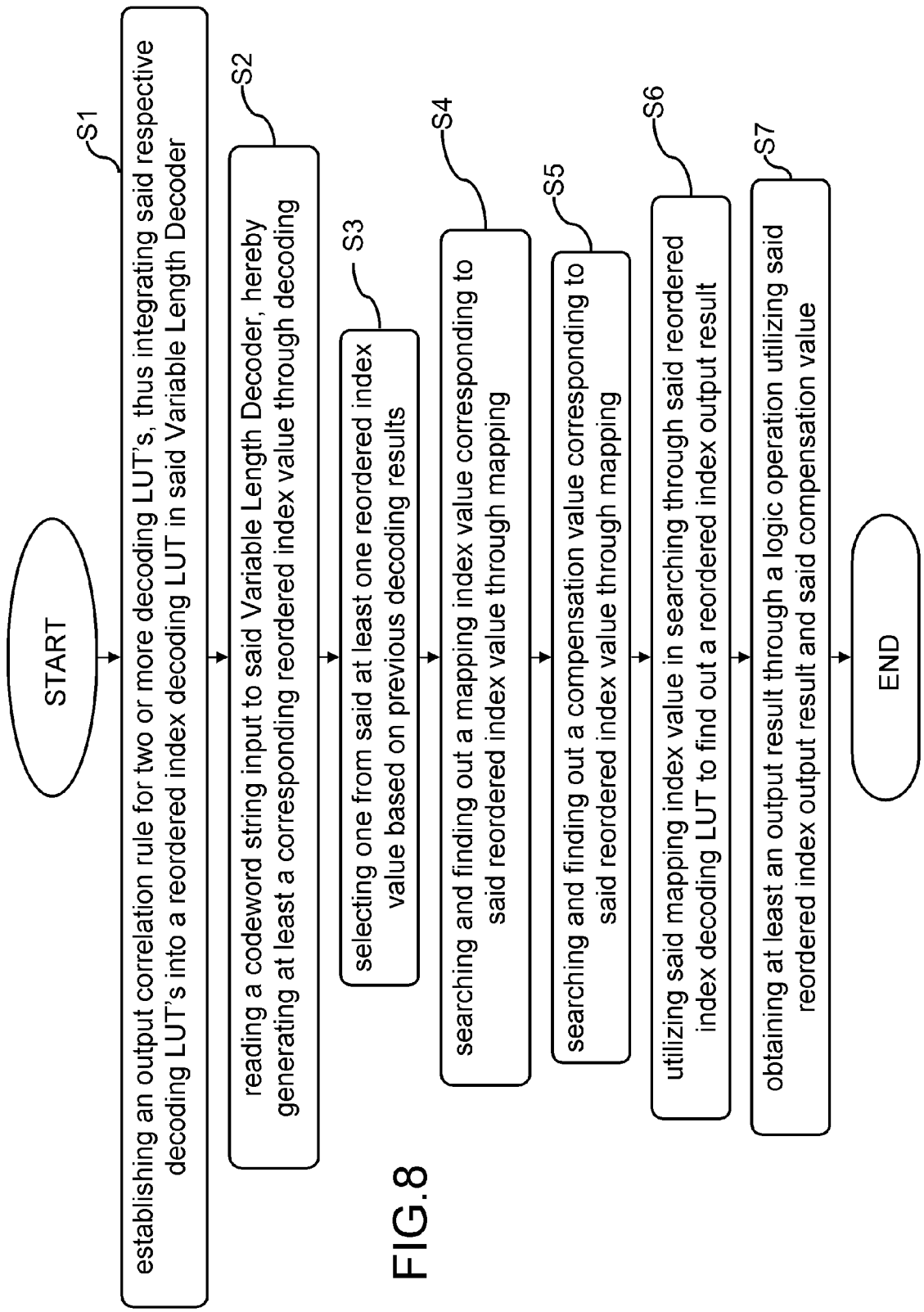
FIG. 8 is a system flowchart of the steps of a variable length decoding method according to an embodiment of the invention.

Finally, the decoding method of the invention is described in this embodiment with reference to FIG. 8, meanwhile, please also refer to FIG. 5, FIGS. 6A & 6B. The prerequisite for implementing the decoding method is that, the reordered index decoding LUT 231 has been processed according to the afore-mentioned output correlation rule and remapping, and the corresponding reordered index value and compensation value correlation table 550 is generated (step S1). In the following, the operations of various functional blocks of a variable length decoder 200 as shown in FIG. 4 are described.

Firstly, reading the codeword string 50 input to the variable length decoder 200, and generating at least a reordered index value through a decoding process (step S2). In this embodiment, the contents of FIG. 4 is taken as an example, the reordered index value generated by the first reordered index decoder 210 belongs to index item 7, while the reordered index value generated by the second reordered index decoder 211 belongs to index item 19.

Next, selecting the reordered index value required for decoding from the two reordered index values by multiplexer 220 as based on the result of the previous decoding (step S3). In this embodiment, the reordered index value of index item 19 generated by the first reordered index decoder 210 as selected by multiplexer 220 is taken as an example for explanation.

The reordered index value of index item 19 thus selected is transmitted respectively to an index remapping device 230 and a compensation mapping device 240 to proceed with the following steps:

(a) searching and finding out the remapping index value 232 of index item 18 corresponding to the reordered index value of index item 19 through the mapping conducted by an index remapping device 230 (step S4); and (b) searching and finding out the LEVEL compensation value 1 corresponding to the reordered index value of index item 19 through the mapping conducted by a compensation mapping device 240 (step S5).

Then, utilizing further the remapping index value 232 of index item 18 in searching and finding out the corresponding reordered index output result 235 by making use of the reordered index decoding LUT 231 (step S6), namely, the RUN value and LEVEL value (0 and 19 respectively) of the reordered index value of index item 18 are output to compensation/output operator 241 as the reordered index output result 235.

Subsequently, upon receiving the reordered index output result 235 (RUN value is 0, while LEVEL value is 19) and the compensation value 1, performing an addition logic operation by the compensation/output operator 241 utilizing the LEVEL value, hereby obtaining the final and actual LEVEL value 20. Thus, finally, the RUN value 0 and LEVEL value 20 are the correct output results, as such completing the decoding process (step S7).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A variable length decoding method utilizing a reordered index decoding look-up-table (LUT), and is applicable in a variable length decoder, comprising the following steps:

establishing an output correlation rule based on two or more decoding LUT's, thus integrating said respective decoding LUT's into a reordered index decoding LUT in said variable length decoder;

reading a codeword string input to said variable length decoder, and generating at least a corresponding reordered index value through decoding;

selecting one of at least one said reordered index value based on the previous decoding result;

executing the following steps utilizing said selected reordered index value:

(a) searching and finding out a remapping index value corresponding to said reordered index value through mapping; and (b) searching and finding out a compensation value corresponding to said reordered index value through mapping;

searching and finding out a reordered index output result through said reordered index decoding look-up-table (LUT) by making use of said remapping index value; and performing a logic operation using said reordered index output result and said compensation value, hereby obtaining at least an output result.

2. The variable length decoding method utilizing a reordered index decoding look-up-table (LUT) as claimed in claim 1, wherein said output correlation rule referred to a relation that all the output items among said respective decoding LUT's are the same, and all said output items having the same output values, thus generating said reordered index values corresponding to said output items in said reordered index decoding look-up-table (LUT).

3. The variable length decoding method utilizing a reordered index decoding look-up-table (LUT) as claimed in claim 2, wherein said output correlation rule referred to a relation that at least one output item among said respective decoding LUT's is the same, and one of said respective decoding LUT's having at least an output item, and the output value of which can be obtained through the operation of a mathematical equation, thus generating said reordered index values corresponding to said output items in said reordered index decoding look-up-table (LUT).

4. The variable length decoding method utilizing a reordered index decoding look-up-table (LUT) as claimed in claim 3, wherein said output correlation rule referred to a relation that at least one output item among said respective decoding LUT's is the same, and all said output values of all said output items of said respective decoding LUT's are not related, thus generating said reordered index values corresponding to said output items in said reordered index decoding look-up-table (LUT).

5. The variable length decoding method utilizing a reordered index decoding look-up-table (LUT) as claimed in claim 4, further including the step of:

performing remapping utilizing said reordered index values, hereby generating said corresponding remapping index values in replacing said reordered index values in said original reordered index decoding look-up-table (LUT).

6. The variable length decoding method utilizing a reordered index decoding look-up-table (LUT) as claimed in claim 5, wherein the total reordered index item number of said reordered index decoding look-up-table (LUT) is the sum of index item number of said respective decoding LUT's undergoing the processing of said output correlation rule and index item number of said respective decoding LUT's undergoing remapping integration.

7. The variable length decoding method utilizing a reordered index decoding look-up-table (LUT) as claimed in claim 1, wherein said logic operation performed can be selected from one of the following comprising the group of: an addition operation, a subtraction operation, and a digit-shifting operation.

8. A variable length decoder utilizing a reordered index decoding look-up-table (LUT), comprising:

at least two reordered index decoder, used to read a codeword string input to said variable length decoder, thus generating at least a corresponding reordered index value separately through decoding;

a multiplexer, used to select one of said at least a reordered index value as an output based on previous decoding results;

an index remapping device, used to search and find out a remapping index value corresponding to said reordered index value through mapping;

a compensation mapping device, used to search and find out a compensation value corresponding to said reordered index value through mapping;

a reordered index decoding look-up-table (LUT), generated through integrating two or more decoding LUT's based on an output correlation rule, and is used to search through said reordered index decoding LUT and find out a reordered index output result by making use of said remapping index value; and a compensation/output operator, used to proceed with a logic operation through utilizing said reordered index output result and said compensation value, thus obtaining at least an output result.

9. The variable length decoder utilizing a reordered index decoding look-up-table (LUT) as claimed in claim 8, wherein said output correlation rule referred to a relation that all the output items among said respective decoding LUT's are the same, and all said output items having the same output values, thus generating said reordered index values corresponding to said output items in said reordered index decoding look-up-table (LUT).

10. The variable length decoder utilizing a reordered index decoding look-up-table (LUT) as claimed in claim 9, wherein said output correlation rule referred to a relation that at least one output item among said respective decoding LUT's is the same, and one of said respective decoding LUT's having at least an output item, and the output value of which can be obtained through the operation of a mathematical equation, thus generating said reordered index values corresponding to said output items in said reordered index decoding look-up-table (LUT).

11. The variable length decoder utilizing a reordered index decoding look-up-table (LUT) as claimed in claim 10, wherein said output correlation rule referred to a relation that at least one output item among said respective decoding LUT's is the same, and all said output values of all said output items of said respective decoding LUT's are not related, thus generating said reordered index values corresponding to said output items in said reordered index decoding look-up-table (LUT).

12. The variable length decoder utilizing a reordered index decoding look-up-table (LUT) as claimed in claim 11, wherein said reordered index decoding LUT is further used to remap said reordered index values, hereby generating said corresponding remapping index values in replacing said reordered index values in said original reordered index decoding look-up-table (LUT).

13. The variable length decoder utilizing a reordered index decoding look-up-table (LUT) as claimed in claim 11, wherein the total reordered index item number of said reordered index decoding look-up-table (LUT) is the sum of number of index items of said respective decoding LUT's undergoing the processing of said output correlation rule and number of index items of said respective decoding LUT's undergoing remapping integration.

14. The variable length decoder utilizing a reordered index decoding look-up-table (LUT) as claimed in claim 8, wherein said logic operation performed can be selected from one of the following comprising the group of: an addition operation, a subtraction operation, and a digit-shifting operation.

15. The variable length decoder utilizing a reordered index decoding look-up-table (LUT) as claimed in claim 8, wherein said reordered index decoding LUT can be realized through a Read Only Memory (ROM), a Content Address Memory (CAM), or a Programmable Logic Array (PLA).

16. The variable length decoder utilizing a reordered index decoding look-up-table (LUT) as claimed in claim 8, wherein the number of said reordered index decoders is equal to that of said decoding LUT.

* * * * *